United States Patent Office 3,402,044

Patented Sept. 17, 1968

3,402,044

LIGHT-SENSITIVE NAPHTHOQUINONE DIAZIDE COMPOSITION AND MATERIAL CONTAINING AN ALKALI INSOLUBLE POLYMER

Thomas L. Steinhoff, South Natick, Charles R. Shipley, Jr., Newton, and John A. MacDonald, Westwood, Mass., assignors to Shipley Company, Inc., Wellesley, Mass., a corporation of Massachusetts No Drawing. Continuation-in-part of application Ser. No. 329,278, Dec. 9, 1963. This application Nov. 23, 1964, Ser. No. 413,286

14 Claims. (Cl. 96—91)

This application is a continuation-in-part of application Ser. No. 329,278, filed Dec. 9, 1963, and entitled, Light-Sensitive Material and Process for the Development Thereof.

The production of printing plates, in particular planographic printing plates, by a process involving the formation of coatings consisting of, or containing, naphthoquinone-1,2)-diazide-sulfonic acid esters on supports such as metal plates or foils, for example, aluminum or zinc, is known. After the coating is dried, the light-sensitive material thus obtained is exposed to light under a master and the exposed coating is developed to produce a visible image by treatment with dilute alkaline solutions, for example, dilute solutions of disodium phosphate, trisodium phosphate, and the like. If a positive master is used, the image, which accepts greasy ink, is a positive reproduction of the master from which copies of the master can be made in an offset printing press.

The foregoing coatings also have potential utility in forming photoresists for metal plating and for etching of metal, plates, ceramics or the like in a pattern, for example in chemical milling or in the manufacture of printed circuits. However, known coatings of this type have often provided inadequate electrical resistance for plating, inadequate chemical resistance to etching solutions which are usually acid, and have provided thin coatings which are difficult to uinformly coat without defects.

Surprisingly, it has been discovered that the above-described light-sensitive coatings can be substantially improved in their above resistance and thickness characteristics by inclusion therein of alkali-resistant, light-insensitive, film-forming materials without losing their capacity for development by mild alkaline solutions. Light exposed portions of coatings containing the included additives can be removed by treatment with mild alkali while leaving unexposed portions on the substrate in the desired pattern.

The light-sensitive compounds, i.e., the naphthoquinone-(1,2)-diazide-sulfonic acid esters which may be employed in the light-sensitive material of the present invention may be, for example, those disclosed in U.S. Patents Nos. 3,046,118, 3,106,465 and 3,148,983.

The naphthoquinone-(1,2)-diazide-sulfonic acid esters preferably employed as photo-sensitizer have an OH group or an esterified OH group in a neighboring position to a carbonyl group and are insoluble in water. To produce superior coatings on the supports, the use in the preparation of the coating solutions of organic solvents in which the naphthoquinone-(1,2)-diazide-sulfonic acid esters are soluble at room temperature is advantageous. If the esters are dissolved in a heated solvent, partial decomposition of the diazo compounds results. Exemplary of suitable solvents are ethyleneglycol monomethyl ether, ethyleneglycol monoethyl ether, aliphatic esters, such as butyl acetate, aliphatic ketones, such as methyl isobutyl ketone and acetone, dioxane, and xylene.

The naphthoquinone-(1,2)-diazide-sulfonic acid esters may be used either alone or as a mixture for the preparation of the light-sensitive coatings. They also can be applied to the supports in association with other ortho-quinone-diazide sulfonic acid esters known to the art. The coatings are formed in known manner, i.e., the coating solutions containing the sulfonic acid esters are whirl-coated, brushed or cast upon the supports, or applied in other suitable manner, and the coating is then dried.

The naphthoquinone-(1,2)-diazide-sulfonic acid esters form coatings free of crystallization and which, therefore, are exceptionally well suited for the photomechanical preparation of printing plates and photoresists. A printing plate is obtained photomechanically from the light-sensitive material in known manner, the light-sensitive coating being exposed under a master to the action of light and the exposed coating being developed with a dilute alkaline solution to produce an image. The developed coating is rinsed with water and, in the portions bared by the developer, the metal support is made water-conductive with a treatment of approximately 1 percent phosphoric acid solution, to which dextrin or gum arabic may be added. When the printing plate is inked up with greasy ink, the ink adheres to the remaining portions of the original light-sensitive coating and positive copies are obtained from positive masters.

Where the light-sensitive material is to be used as a photoresist, the metal support, in the portions bared by the developer, is treated with a suitable etching solution for a time sufficient to etch the metal base to the desired degree. After etching, the plate is rinsed and the remaining light-sensitive coating is removed, if desired, for example, by treatment with an organic solvent such as one of those disclosed above as useful in the preparation of the light-sensitive coatings.

In addition to the naphthoquinone-(1,2)-diazide-sulfonic acid esters the light-sensitive coating preferably includes an alkali-soluble resin, exemplary of which are the phenol- and cresol-foramldehyde novolaks. Even small additions are beneficial but wher highly etch-resistant layers are to be preduced for the preparation of photoresists, the light-sensitive compounds can be mixed with the alkali-soluble resins in proportions ranging from about 1:1 to 1:6 by weight, based upon the quantity of light-sensitive material present. Because the necessary etch resistance requires a high percentage of resin and while at the same time considerable proportions of the light-sensitive compound must be present in the layer to ensure an easy development thereof, very high demands are made upon the light-sensitive compounds with regard to their solubility and compatibility with resins. These demands are met by light-sensitive compounds utilized in the present invention.

Due to their particular chemical structure, the light-sensitive compounds utilized in the present invention have particularly favorable characteristics as regards their solubility in organic solvents at room temperature and their compatibility with high quantities of resins. These advantages facilitate the preparation of highly etch-resistant, homogeneous layers which are excellently suitable for the preparation of relief and intaglio printing plates as well as photoresists. Further, the layers of the present invention can, in contradistinction to the more cumbersome transfer process using pigment paper, be directly applied to the metals to be etched, i.e., plates or cylinders, and the process can be further simplified due to the fact that positive copies can be produced whereas pigment paper is suitable for the production of negative copies only.

The light-sensitive layers may also contain plasticizers compatible with the resins such as dioctyl phthalate, dibutyl phthalate, or mineral oil but the inclusion of plasticizers is optional. Dyestuffs can also be included in the layers in order to make the coating and the developed image more visible.

The coating additives according to this invention must be alkali-resistant, film-forming materials. They are film-forming for purposes of this invention if they can be cast from melt or solvent liquids to a continuous film without other film-forming materials and without requiring further polymerization as by baking. They are considered alkali-resistant if a dry film thereof $2.5 \times 10^{-4}$ inches in thickness will withstand treatment with 0.4 N KOH, and preferably 1.0 N KOH, for 10 minutes at 30° C. without attack visible to the unaided eye. Acid resistance is also preferred where acid etching or plating solutions are to be employed. Useful additives are also those which are essentially unaffected by a ten minute exposure to 2000 foot candles intensity at wavelengths of about 3000 to 5000 angstroms, the light responsive range of the photosensitizers employed herein. Additionally, additives according to this invention must be capable of forming a non-tacky dried film after casting within about 10 minutes at 100° C.; be compatible with the photosensitizers employed, that is, mix therewith without separation and without chemical reaction, in both liquid coating and dried film form; and have a molecular weight between about 500 and 12,000.

The quantity of additive employed in the photosensitive coating composition can be varied considerably. Small amounts improve the resulting coatings and increasing amounts show increased improvement until development is inhibited. Amounts up to approximately the weight of alkali soluble solids, namely, the photosensitizer and novolak resin, can be tolerated. At such high inclusions, development will remove the photosensitizer decomposition products and novolak but leave the additive as a porous, frangible film which can be brushed or abraded away without removing unexposed coating. Lesser amounts, generally less than one-half the weight of alkali-soluble solids, are preferred as illustrated in the examples given below. Preferred amounts are removed by the developer at exposed areas without removing unexposed coating areas. Too great an excess will prevent development. The quantity of solvent in the coating composition can also be varied as desired.

The invention will be further illustrated by reference to the following specific example:

EXAMPLE 1

A light-sensitive coating solution was prepared having the following composition:

(1) Ethylene glycol monomethyl ether (99% pure) ---------- liters -- 168
(2) Alkali-soluble phenol-formaldehyde novolak resin (Alnovol 429 K) ---------- kg -- 21.0
(3) Solid copolymer containing 25 to 35 percent by weight of alpha-methyl styrene and 75 to 65 percent by weight of vinyl toluene (described in USP 3,000,868) ---------- kg -- 21.0

(4) Butyl acetate (90 to 92% pure) ---------- liters -- 21.0
(5) Xylene ---------- do ---- 21.0
(6) Oil soluble blue II (dyestuff) ---------- kg -- 1.06
(7) Sensitizer ---------- kg -- 6.3

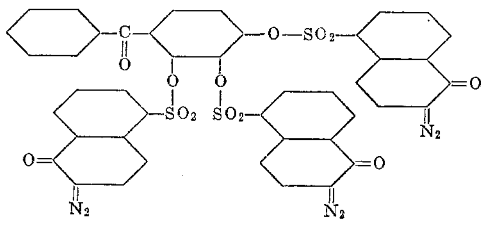

This coating solution is coated onto a laminated base material, i.e., an epoxy paper laminate having a copper foil weighing 1 ounce per square foot laminated thereto using a plate-whirler rotating at 78 r.p.m. The light-sensitive coating solution is fed onto the spinning foil at the center of rotation and the spinning is continued for a period of 5 minutes. The coating is dried as applied using a 250 watt infra-red radiator mounted approximately 6 inches above the center of rotation. The coated support is then placed in a circulating air oven, at a temperature of 150° F. for about 15 minutes, to complete drying.

The coating, prepared in the absence of activating radiation, is then exposed for about 2.5 minutes through a transparency, positive or negative, as desired, using a carbon arc of an intensity of 2000 foot candles at a distance of one foot as a light source. The exposed coating is then developed by immersion in or swabbing with a developer such as 0.25 N potassium hydroxide, trisodium phosphate, disodium phosphate or triethanolamine. If immersion is employed, it is effected for about 1.5 minutes at a temperature of 70° F.

Using the foregoing procedure, a coating thickness of about 70 millionths of an inch is obtained whereas in a comparable foil where the polymerized vinyl compound is omitted, a thickness of about 45 millionths of an inch is obtained.

The developed foil can be used as a printing plate or template or can be used in etching or plating operations, the coating serving as an etching or plating resist. The copper base can be etched, for example, with 42° Bé. ferric chloride solution for about 5 to 10 minutes. After etching, the plate is rinsed and the remaining light-sensitive coating is removed by treatment with a suitable organic solvent.

Additional examples are given in the following table wherein Example 1 above is included for comparison.

TABLE

| Composition | Example | | | | | |
|---|---|---|---|---|---|---|
| | 1 | 2 | 3 | 4 | 5 | 6 |
| (1) Sensitizer,[a] Kg | 6.3 | 10.6 | 9.45 | 9.45 | 9.45 | 9.45 |
| (2) Novolak,[a] Kg | 21 | 35.4 | 31.5 | 31.5 | 31.5 | 31.5 |
| (3) Dye,[a] Kg | 1.06 | 1.8 | ---- | ---- | ---- | ---- |
| (4) Butyl Acetate, liters | 21 | 21 | 18.7 | 18.7 | 18.7 | 18.7 |
| (5) Xylene, liters | 21 | 21 | 18.7 | 18.7 | 18.7 | 18.7 |
| (6) Ethylene glycol monomethyl ether, liters | 168 | 168 | 150 | 150 | 150 | 150 |
| (7) Additive: | | | | | | |
| Alpha-methyl stryene copolymer,[a] Kg | 8.4 | ---- | 1.11 | ---- | ---- | ---- |
| Polystyrene,[b] Kg | ---- | 8.4 | ---- | ---- | ---- | ---- |
| Melamine,[c] KJ | ---- | ---- | 6.9 | 6.9 | 6.9 | ---- |
| Sucrose benzoate,[d] Kg | ---- | ---- | ---- | ---- | 5.55 | 5.55 |
| Coating Thickness [e]: | | | | | | |
| Example | 70 | 210 | 250 | 150 | 200 | 150 |
| Control | 45 | 120 | 100 | 100 | 100 | 100 |

[a] As indentified in Example 1.
[b] Molecular weight about 5000.
[c] Resimene 882 of the Monsanto Chemical Company, the reaction product of melamine, formaldehyde and butyl alcohol according to Product Information Bulletin No. 1094.
[d] $C_{12}H_{14}O_3(C_6H_5COO)_{7.4\ average}$, as commercially available.
[e] Inches$\times 10^6$ when coated as specified in Example 1. Control is the thickness obtained by the same procedure and composition but omitting the additive.

An additional additive material which can be substituted for the melamine resin in Examples 3–5 is the reaction product of benzoguanamine (2,4-diamino-6-phenyltriazine-1,3,5), formaldehyde and butyl alcohol according to procedures published by the Tennessee Products and Chemical Corporation of Nashville, Tenn. Benzoguanamine is a substituted melamine wherein one melamine amino group has been replaced with a phenyl group. Its reactions and resins products are generally similar to those of melamine. As is known for both melamine and benzoguanamine resins, other lower alkyl monoalcohols can be substituted for butyl alcohol although the latter is preferred.

In addition to the thicker, more resistant photo-sensitive coatings produced by this invention, the coatings are less expensive per unit of thickness since the proportion of the relatively expensive photosensitizer is decreased. Also, the coatings are more easily applied without defects, especially as photo-resists, and the coatings are more flexible. Further, the coatings permit faster, cleaner development with higher pH developers, are more tolerant to temperature and time variations in the developer, and provide smoother, harder coatings with improved heat resistance. Thus, while the light-sensitive material according to this invention can be advantageously used in the preparation of planographic printing plates and the like, it is of particular utility in the production of photo-resists for metal plating or for the etching of metal, ceramic and plastics, useful in chemical milling, and in the manufacture of semi-conductors and printed circuits.

It will be obvious to those skilled in the art that many modifications may be made within the scope of the present invention without departing from the spirit thereof, and the invention includes all modifications within the scope of the appended claims.

We claim:

1. In an alkali-developable photo-sensitive coating composition comprising a liquid dispersion of a naphthoquinone-(1,2)-diazide-sulfonic acid ester as photo-sensitizer and an alkali soluble resin, the improvement characterized in that said composition includes means in an amount not greater than the weight amount of the alkali soluble solids content for increasing the thickness, chemical and electrical resistances of the coating, said means comprising an electrically insulating film-forming material which is alkali resistant, substantially insensitive to light at a wave length between 3000 and 5000 angstroms, forms a non-tacky dried film within 10 minutes at 100° C., is compatible with the photo-sensitizer composition and has a molecular weight in the range of 500 to 12,000, said means being selected from the group consisting of polystyrene; copolymers of alpha-methyl styrene and vinyl toluene; the polymeric reaction product of melamine, formaldehyde and a lower alkyl monoalcohol; the polymeric reaction product of benzoguanamine, formaldehyde and a lower alkyl monoalcohol; and sucrose benzoate, said composition being especially adapted for use as a resist in electroplating and metal etching.

2. A coating composition according to claim 1, wherein the alkali-soluble solids of said composition exceed by weight the amount of said means by at least 2 to 1.

3. A coating composition according to claim 1, wherein said means is polystyrene.

4. A coating composition according to claim 1, wherein said means is a copolymer of alpha-methyl styrene and vinyl toluene.

5. A coating composition according to claim 1, wherein said means is the polymeric reaction product of melamine, formaldehyde and a lower alkyl monoalcohol.

6. A coating composition according to claim 1, wherein said means is the polymeric reaction product of benzoguanamine, formaldehyde and a lower alkyl monoalcohol.

7. A coating composition according to claim 1, wherein said means is sucrose benzoate.

8. Light sensitive material specially adapted for use as a photo-resist comprising a base having on at least one surface thereof a dried coating comprising a naphthoquinone-(1,2)-diazide sulfonic acid ester as photo-sensitizer, an alkali soluble novolak resin and means for increasing the thickness, chemical and electrical resistance of the coating, said means comprising an electrically insulating film-forming material which is alkali resistant, substantially insensitive to light at a wave length between 3000 and 5000 angstroms, forms a non-tacky dried film within 10 minutes at 100° C., is compatible with the photo-sensitizer composition and has a molecular weight in the range of 500 to 12,000 and selected from the group consisting of polystyrene; copolymers of alpha-methyl styrene and vinyl toluene; the polymeric reaction product of melamine, formaldehyde and a lower alkyl monoalcohol; the polymeric reaction product of benzoguanamine, formaldehyde and a lower alkyl monoalcohol, and sucrose benzoate, said means being present in an amount not greater than the weight amount of the alkali soluble solids.

9. Light-sensitive material according to claim 8, wherein the alkali-soluble solids of said composition exceed by weight the amount of said means by at least 2 to 1.

10. Light-sensitive material according to claim 8, wherein said means is polystyrene.

11. Light-sensitive material according to claim 8, wherein said means is a copolymer of alpha-methyl styrene and vinyl toluene.

12. Light-sensitive material according to claim 8, wherein said means is the polymeric reaction product of melamine, formaldehyde and a lower alkyl monoalcohol.

13. Light-sensitive material according to claim 8, wherein said means is the polymeric reaction product of benzoguanamine, formaldehyde and a lower alkyl monoalcohol.

14. Light-sensitive material according to claim 8, wherein said means is sucrose benzoate.

References Cited

UNITED STATES PATENTS

| | | | |
|---|---|---|---|
| 2,772,972 | 12/1956 | Herrick et al. | 96—91 X |
| 3,126,281 | 3/1964 | Sus et al. | 96—91 X |
| 3,145,104 | 8/1964 | Oster et al. | 96—36.2 |
| 3,149,972 | 9/1964 | Herrick et al. | |
| 3,201,239 | 8/1965 | Neugebauer et al. | 96—36.3 |

FOREIGN PATENTS

| | | |
|---|---|---|
| 706,028 | 3/1954 | Great Britain. |
| 602,980 | 8/1960 | Canada. |
| 1,081,757 | 5/1960 | Germany. |

J. TRAVIS BROWN, *Acting Primary Examiner.*

C. BOWERS, *Assistant Examiner.*